United States Patent [19]

Yokoyama

[11] 4,166,574

[45] Sep. 4, 1979

[54] APPARATUS FOR MARKING IDENTIFICATION SYMBOLS ON WAFER

[75] Inventor: Masanori Yokoyama, Chigasaki, Japan

[73] Assignee: Tokyo Shibaura Electric Co., Ltd., Japan

[21] Appl. No.: 911,234

[22] Filed: May 31, 1978

[30] Foreign Application Priority Data

| Jun. 7, 1977 | [JP] | Japan | 52-67502 |
| Jun. 7, 1977 | [JP] | Japan | 52-67503 |
| Jun. 7, 1977 | [JP] | Japan | 52-67504 |
| Jun. 7, 1977 | [JP] | Japan | 52-67505 |
| Jun. 7, 1977 | [JP] | Japan | 52-67506 |
| Sep. 7, 1977 | [JP] | Japan | 52-107504 |

[51] Int. Cl.² ............... G06K 17/00; B01J 17/00; G06K 7/14; G06K 19/06
[52] U.S. Cl. ............... 235/375; 29/569 R; 235/464; 235/487; 346/102
[58] Field of Search ............... 235/375, 376, 419, 431, 235/464, 487; 346/33 MC, 56, 62, 63, 64, 67, 102; 364/475; 29/569, 569 L, 574; 250/555, 570

[56] References Cited

U.S. PATENT DOCUMENTS

| 3,600,556 | 8/1971 | Acker | 235/464 |
| 3,700,859 | 10/1972 | Laurer et al. | 235/464 |
| 3,935,427 | 1/1976 | Geul | 235/487 |
| 3,991,883 | 11/1976 | Hobler et al. | 235/464 |
| 4,095,095 | 6/1978 | Muraoka et al. | 235/487 |

Primary Examiner—Daryl W. Cook
Attorney, Agent, or Firm—Finnegan, Henderson, Farabow & Garret

[57] ABSTRACT

An apparatus for marking identification symbols on a wafer including: a marking means for marking identification symbols on the wafer; a reading means for reading the marked identification symbols; a comparing means for comparing data of the identification symbols which are read by the reading means with basic data on which the identification symbols are marked on the wafer, and a judging means for inspecting and judging from a result of the comparison whether the desired identification symbols are marked on the wafer or not.

7 Claims, 9 Drawing Figures

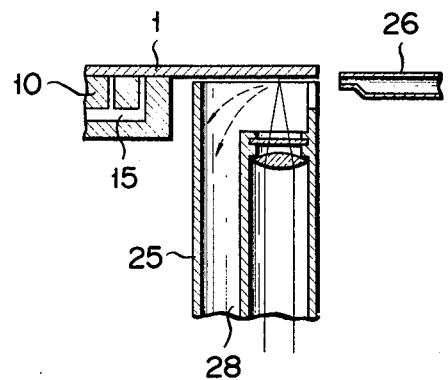
F I G. 5
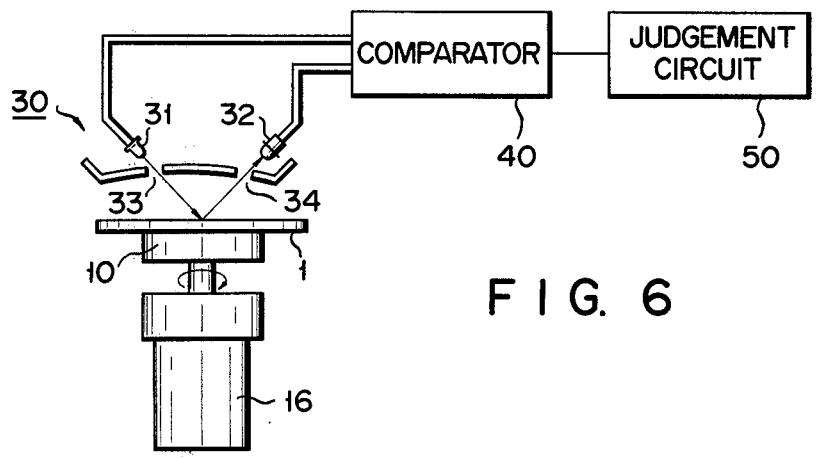
F I G. 6
F I G. 7a
F I G. 7b
F I G. 7c
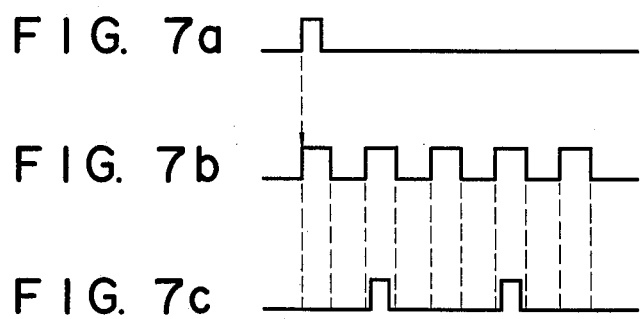

APPARATUS FOR MARKING IDENTIFICATION SYMBOLS ON WAFER

The present invention relates to an identification symbol marking apparatus capable of marking the symbols on a wafer which is used for manufacturing a semiconductor device and also capable of judging whether these symbols are correctly marked or not.

Controlling a wafer for use in the production of a semiconductor device such as a transistor and an integrated circuit generally is effected according to, for example, a lot in which 20 to 30 sheets of wafers make a unit, a kind of the semiconductor device to be manufactured, and a manufacturing process of each kind of the device. Accordingly, each wafer is distinguished by marking on each sheet of the wafer the identification symbols necessary for controlling the wafer according to these conditions.

Conventionally, such identification symbols were represented by only the figures or by the combination of figures and English letters, which have been marked in by hand operation. Accordingly, an efficiency of the marking was low and a correct control of the wafer was difficult due to a clerical error in marking. On the other hand, when the wafer was tried to be automatically controlled using an electronic computer, there was found no means to obtain a information from the identification symbols marked on the wafer, so that it was impossible to realize the automatic control of the wafer.

Accordingly, it has been desired that a correct and efficient apparatus for marking the identification symbols and an automatic control system are developed.

An object of this invention is to realize an automatic control of the wafer, and to accurately and efficiently control the wafer.

Another object of this invention is to provide an apparatus for marking the identification symbols on the wafer which is capable of automatically marking the identification symbols, of reading the marked symbols, and of judging whether or not the marked identification symbols are correct.

According to this invention, there can be provided an apparatus for marking identification symbol which comprises a marking means for marking identification symbols on a wafer; a reading means for reading the marked identification symbols; a comparing means for comparing data of the symbols which are read by the reading means with basic data on which the identification symbols are marked on the wafer; and a judging means for inspecting and judging from a result of the comparison whether the identification symbols are correctly marked on the wafer.

In the preferred embodiment of this invention, identification symbols marked on a circular wafer are bar-shape codes radially arranged in the marginal portion of the circular wafer. In this case, the rotation of the wafer placed on a rotating plate enables the marking and photoelectrically reading of the bar codes to be very easily executed on the same rotating plate.

This invention can be more fully understood from the following detailed description when taken in conjunction with the accompanying drawings, in which:

FIG. 5 shows a sectional view of an embodiment of a marking means provided with a chip collecting vessel and designed for the purpose of marking the symbols in the under surface of the wafer by the use of laser rays;

FIG. 6 schematically illustrates a reading means, comparing means and judging means of the identification symbols marked on the wafer; and FIGS. 7a, 7b and 7c each shows an example of pulses used for comparison and inspection of the identification symbols marked on the wafer, that is, FIG. 7a represents a start pulse, FIG. 7b clock pulses and FIG. 7c pulses corresponding to the identification symbols which are read, respectively.

Figure 1:
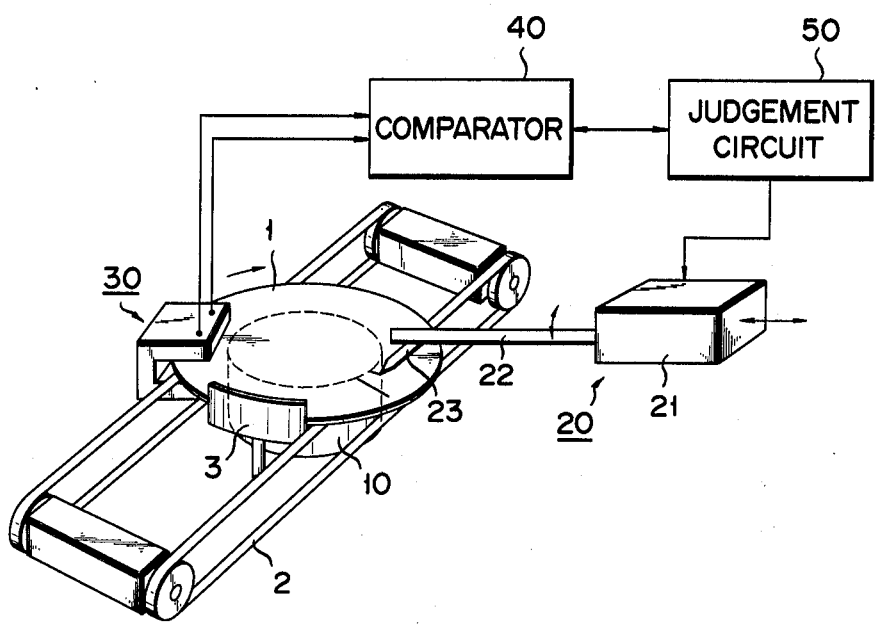
FIG. 1 shows a perspective view of an embodiment of an identification symbol marking apparatus according to this invention.

In FIG. 1, a circular wafer 1 is fixed on a rotating plate 10 by means of a chuck mechanism (not shown), for example, vacuum suction or the like. A means for carrying the wafer 1 onto the rotating plate 10 is not particularly limited, but a belt conveyor 2 as shown in FIG. 1 is more advantageous. The wafer 1 carried by the belt conveyor 2 is stopped at a predetermined position by a stopper 3 movable upward and downward through a drive mechanism (not shown) such as a solenoid. In such a case, the rotating plate 10 is adapted movable upward and downward by means of a drive mechanism (not shown) such as a solenoid and raised from lower part to fix the wafer 1. In another way, it is just as well to employ a mechanism in which the rotating plate is not moved upward and downward, but the belt conveyor is moved upward and downward. After the wafer 10 is fixed on the rotating plate 10, the stopper 3 is lowered by the drive mechanism.

Figure 2:
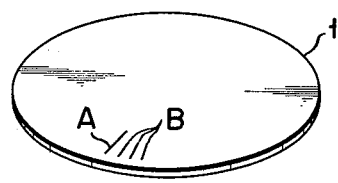
FIG. 2 shows a perspective view of a wafer on which the identification symbols are marked.

The wafer 1 fixed on the rotating plate 10 is marked with the identification symbols such as a lot number and a wafer number etc. by a marking means 20. These identification symbols are preferably represented by bar-shape codes which are radially arranged in the marginal portion of the wafer 1, as shown in FIG. 2. These bar codes are composed of a notice code A necessary for the automatic reading and an identification code B. The bar codes are provided on the marginal portion of the wafer 1 which fails to be utilized to form semiconductor chips. The notice code A is a one which indicates the presence of the identification code B on the same circumference of the wafer 1 along the rotating direction thereof.

The marking means 20 may be either a diamond cut device or a laser cut device for applying a groove cutting work to the surface of the wafer 1. The marking means 20 is automatically operated according to basic data stored in such a judging means 50 as a computer. The diamond cut device comprises a diamond cutter 23 equipped at the top of a lever 22 which is supported by the device main body 21, as shown in FIG. 1, and the device itself is well known. Also the laser cut device itself is known well.

In the example of FIG. 1, when the wafer 1 is secured on the rotating plate 10, the lever 22 is lowered to permit the diamond cutter 23 to be brought into contact with the surface of the wafer 1. The bar code is marked on the wafer 1 by moving the device main body 21 or the rotating plate 10 in the radial direction of the wafer 1, while adjusting the pressure applied to the diamond cutter 23. Thereafter, the lever 22 is raised to permit the rotating plate 10 to be turned by the predetermined distance, and then another bar code is radially marked on the wafer surface by repeating successively the above mentioned marking operation.

Figure 3:
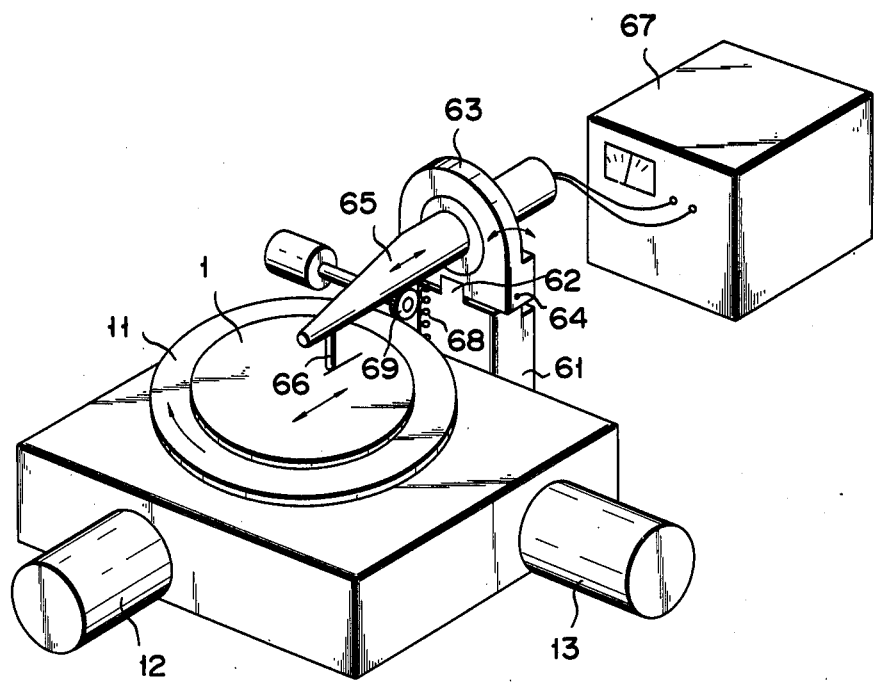
FIG. 3 shows a perspective view of an embodiment of a marking means of which diamond cutter is equipped in a ultrasonic horn.

To increase the efficiency for the marking of the identification symbols, it is preferable to vibrate the diamond cutter by using a ultrasonic wave. In the example of FIG. 3, a swinging member 63 is swingingly supported at an projected portion 62 formed on the upper end of a support member 61 by a pin 64. A ultrasonic horn 65, of which top end is equipped with a diamond cutter 66, is disposed penetrating the swinging member 63. Since the ultrasonic horn 65 is electrically connected to a ultrasonic wave source 67, the diamond cutter 66 is principally given a fine vibration made in the longitudinal direction of the horn 65. The bar codes may efficiently be marked on the wafer 1 by moving a rotating plate 11 or the support member 61 in the radial direction of the wafer 1 by means of a motor 12, while applying to the diamond cutter 66 the fine vibration and a pressure produced by a spring 68. After a bar code is marked, the diamond cutter 66 is separated from the surface of the wafer 1 by an eccentric cum 69 and the rotating plate 11 is rotated by the predetermined distance by means of a motor 13, thus repeating the above mentioned operations. Where the diamond cut device is not vibrated by the ultrasonic wave, the depth of the groove formed reaches only approximately 20μ, while where it be given the ultrasonic vibration, the depth reaches approximately 30μ.

Figure 4:
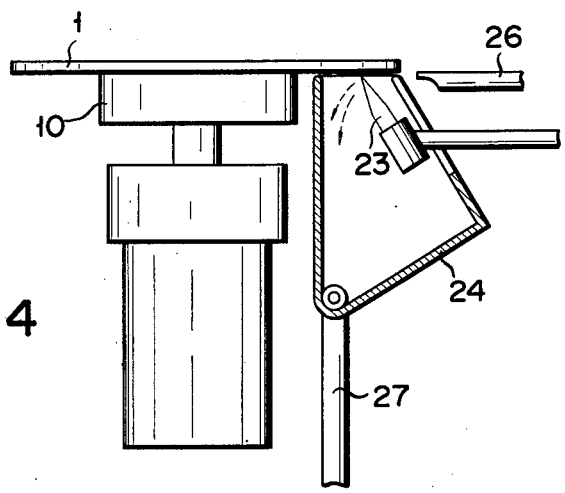
FIG. 4 shows a partially sectional view of an embodiment of a marking means provided with a chip collecting vessel and designed for the purpose of marking the symbols in the under surface of the wafer by the use of the diamond cutter.

Sawdust produced when the identification symbols are marked on the wafer adhere to the wafer surface and cannot be removed by an ordinary washing method. The sawdust causes to considerably decrease the yield of producing a semiconductor device because, for example, the adhesion between the wafer and the photo-mask is reduced. Hereupon, it is preferred that the identification symbols are marked on the under surface of the wafer horizontally supported by the rotating plate, for preventing the sawdust from being adhered to the wafer. In this manner, the sawdust produced are fallen downward by the action of gravity without adhesion to the wafer surface. The wafer surface to be marked with the identification symbols may be either the surface on which a semiconductor region should be formed or not. Further, FIGS. 4 and 5 show examples of marking means which are provided with sawdust collecting vessels 24 and 25, respectively. The sawdust produced when the symbols are marked by the diamond cutter 23 or laser rays are forced to be blown off by air blasted from a compressed air nozzle 26, and then fallen into the sawdust collecting vessels 24 and 25 disposed in such a manner as to surround the portion of the wafer 1 where the symbols are marked. The fallen sawdust is exhausted from pipes 27 and 28 provided at the lower part of the vessels 24 and 25, respectively, by air suction. Moreover, the wafer 1 is fixed by means of a air suction mechanism 15 of the rotating plate 10. Using the marking means provided with such a sawdust collecting vessel, adhesion of the sawdust to the wafer surface can completely be prevented.

With an end of the marking of the identification symbols, the rotating plate 10 is rotated by means of the motor, the marked identification symbols in the wafer 1 are supplied to a reading means where the symbols are inspected and judged whether they are correctly marked or not. That is to say, as shown in FIG. 6, the wafer 1 is rotated at a constant speed by the motor 16, and light is emitted from a light projecting unit 31 at the same time. This emitted light after passing through a slit 33 is reflected on the surface of the wafer 1, as shown by an arrow. The reflected light reaches a light receiving unit 32 through a slit 34. An emission diode or a laser emitting device is preferable to be used for the light projecting unit 31, though even an ordinary electric bulb is sufficiently available for it. On the other hand, for the light receiving unit 32, a photoelectro transducer such as a photo-trannsistor and a photo-diode is used.

When the emitted light is applied to a notice code on the wafer surface, the quantity of the reflected light is reduced and accordingly, photoelectric current at the light receiving unit 32 is reduced. The reduction of this photoelectric current generates a start pulse (FIG. 7a) at a comparing means such as comparator 40 and a clock pulse (FIG. 7b) is produced in response to the start pulse at the comparator 40. Thereafter, as the wafer 1 is rotated the identification codes are read by turns, and pulses (FIG. 7c) corresponding to these codes ae produced in succesion after the start pulse. Accordingly, the comparator 40 synchronizes the clock pulse with the pulse corresponding to the identification code and compares the both to provide data of the identification symbols marked on the wafer.

The comparator 40 is supplied with basic data on which the identification symbols are marked on the wafer from the judging means, for example, judgement circuit 50. The comparator 40 makes also a comparison between the basic data and the afore-mentioned identification symbol data. The results of the comparison are set forth to the judgment circuit 50 to inspect and judge whether or not the foregoing both data are in the agreement with each other, that is, whether the identification symbols are correctly marked on the wafer or not. The results of the judgement are displayed on a display section of the judging means 50. These comparing means and judging means are subject to no limitation if capable of fulfilling their functions as mentioned above, and are considered to be apparently understood and readily to be embodied by those skilled in the art on the basis of the explanations as given hereinbefore. Therefore, the detailed descriptions of these means are omitted.

The identification symbol marking device according to this invention makes an automatic marking of the identification symbols on the wafer with a high efficiency and moreover, is capable of inspecting whether the marking correctly made or not, so that reliability of the marking is raised.

With the bar-shape codes radially arranged in the marginal portion of the wafer surface, the operations of not only marking but also reading, comparing and judging the codes are automatically carried out by use of an electronic computer. Accordingly, the present invention makes it possible to automatically control the wafer.

What is claimed is:

1. An apparatus for marking identification symbols on a wafer surface comprising: a marking means for marking the identification symbols on the wafer surface; a reading means for reading the marked identification symbols on the wafer surface; a comparing means for making comparison of data of the marked symbols which are read by the reading means with basic data on which said identification symbols are marked on the wafer surface; and a judging means for inspecting and judging from the result of the comparison of the both data whether the identification symbols are correctly marked on said wafer surface.

2. The apparatus according to claim 1, wherein said marking means marks bar-shape codes which are radially arranged in the marginal portion of the wafer surface.

3. The apparatus according to claim 2, wherein said apparatus further comprises a rotating plate which fixes said wafer, and said reading means is a photoelectric reading means which reads the identification symbols marked on the wafer while turning round the rotating plate, after the identification symbols are marked on the wafer fixed on said rotating plate.

4. The apparatus according to any one of claims 1 to 3, wherein the marking means is a diamond cut device or a laser cut device.

5. The apparatus according to claim 4, wherein a diamond cutter is finely vibrated by ultrasonic wave.

6. The apparatus according to claim 4, wherein said marking means is disposed in the under side of the wafer to mark the identification symbols on the under surface of the wafer.

7. The apparatus according to claim 6, wherein said marking means is provided with a sawdust collecting vessel disposed in such a manner as to surround the portion of the wafer surface where the identification symbols are marked.

* * * * *